United States Patent [19]
Mori et al.

[11] Patent Number: 5,454,424
[45] Date of Patent: Oct. 3, 1995

[54] METHOD OF AND APPARATUS FOR CASTING CRYSTALLINE SILICON INGOT BY ELECTRON BEAN MELTING

[75] Inventors: Nobuyuki Mori, 4-45-4, Kamitakada, Nakano-ku, Tokyo; Masafumi Maeda, Niiza, both of Japan

[73] Assignee: Nobuyuki Mori, Tokyo, Japan

[21] Appl. No.: 107,704

[22] PCT Filed: Dec. 17, 1992

[86] PCT No.: PCT/JP92/01646

§ 371 Date: Aug. 18, 1993

§ 102(e) Date: Aug. 18, 1993

[87] PCT Pub. No.: WO93/12272

PCT Pub. Date: Jun. 24, 1993

[30] Foreign Application Priority Data

Dec. 18, 1991 [JP] Japan ...................................... 3-353585

[51] Int. Cl.⁶ .................................................. B22D 11/00
[52] U.S. Cl. ........................... 164/469; 164/484; 164/488
[58] Field of Search ..................................... 164/469, 474, 164/475, 484, 488, 437, 441, 122.2

[56] References Cited

U.S. PATENT DOCUMENTS

| | | | |
|---|---|---|---|
| 2,541,764 | 2/1951 | Herres et al. | 164/469 |
| 3,247,554 | 4/1966 | Hanks et al. | 164/469 |
| 4,027,722 | 6/1977 | Hunt | 164/469 |
| 4,356,861 | 11/1982 | Winter | 164/122.2 |
| 4,627,148 | 12/1986 | Imahashi et al. | 164/469 |
| 4,641,704 | 2/1987 | Lowe | 164/469 |
| 4,730,661 | 3/1988 | Stephan | 164/469 |
| 4,830,665 | 5/1989 | Winland | 164/475 |
| 4,838,340 | 6/1989 | Entrekin et al. | 164/469 |
| 4,936,375 | 6/1990 | Harker | 164/469 |

FOREIGN PATENT DOCUMENTS

| | | | |
|---|---|---|---|
| 63-157739 | 6/1988 | Japan | 164/469 |
| 63-212061 | 9/1988 | Japan | 164/469 |

Primary Examiner—Mark Rosenbaum
Assistant Examiner—James Miner
Attorney, Agent, or Firm—Wenderoth, Lind & Ponack

[57] ABSTRACT

This invention aims at casting a large silicon crystal grain-containing ingot (14) by melting a silicon material (20) by scanning the same with an electron beam, and gradually cooling molten silicon (5) thus obtained. A method of casting a crystalline silicon ingot by electron beam melting, involves of the steps of melting a silicon material (20) by scanning the same with an electron beam, cooling the outer lower surface of molten silicon (5) thus produced while increasing the temperature of the molten silicon (5) suitably so as to generate crystals thereof, and gradually precipitating a crystalline silicon ingot (14) by the weight of itself in accordance with the generation of the crystals. An apparatus is provided for casting crystalline silicon ingot by electron beam melting, in which silicon material supply means (2, 3) are provided at one side of a cold hearth (1), one side portion of a crucible (8, 8a) being joined to the upper portion of the other side of the cold hearth (1) via a groove (7), electron guns (16a, 16), a cooling means (10, 10a) being attached to the wall of the crucible (8, 8a), retaining means (15, 15a) for crystalline silicon ingot (14) being provided at the lower side of the crucible (8, 8a) so that the retaining means for the crystalline silicon ingot (14) can be vertically moved or both vertically and rotationally moved. The crystalline silicon ingot is lifted up at some point at a very slow speed so as to remove some part of the molten silicon which has a high concentration of impurities.

5 Claims, 9 Drawing Sheets

METHOD OF AND APPARATUS FOR CASTING CRYSTALLINE SILICON INGOT BY ELECTRON BEAN MELTING

TECHNICAL FIELD

This invention is related to a method of and apparatus for casting of crystalline silicon ingot by electron beam melting for the purpose of casting a large silicon crystal grain-containing ingot from a molten silicon which is melted by electron beam.

BACKGROUND ART

Figure 11:
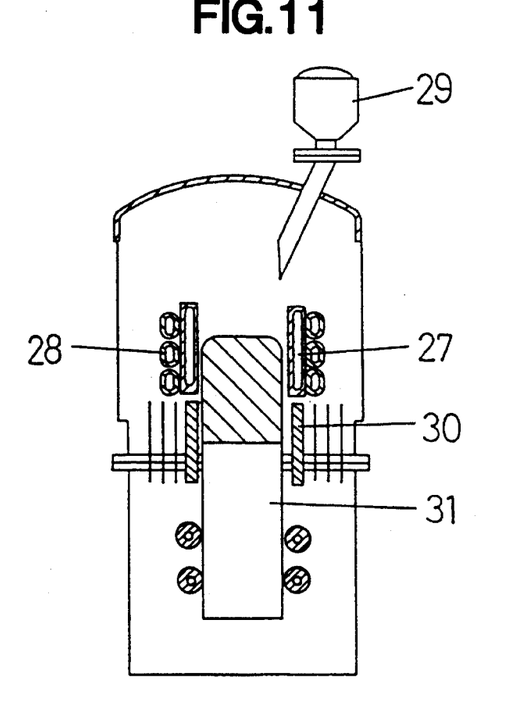
FIG. 11 is an illustration of a part of the cross section of a conventional apparatus for cold crucible melting and casting method.
Figure 12:
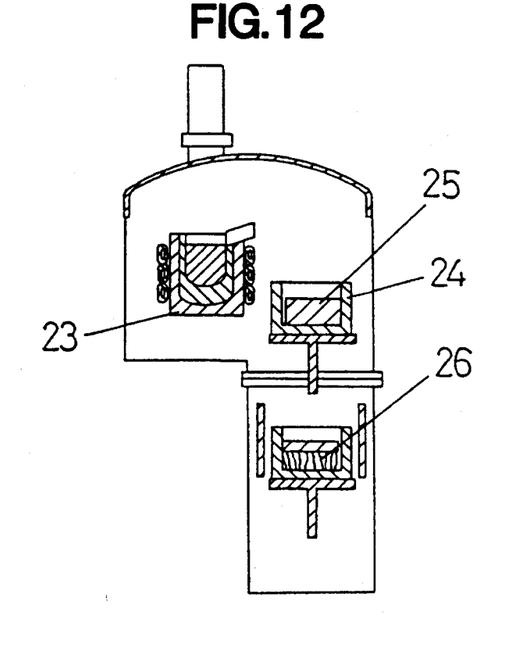
FIG. 12 is an illustration of a part of the cross section of a conventional apparatus for WICP melting and casting method.

A known, conventional method for casting crystalline silicon ingot, is described as follows. First, poly-silicon was charged as a raw material and melted in the highly-pure quartz crucible 23 in vacuum or inert gas atmosphere shown in FIG. 12, and after melting down, the melt is charged into the mold 24 which is made of the highly-pure graphite. The silicon in a liquid state 25 in the mold 24 is cast in ingot form being pulled down in a very slow speed through the heated zone which is controlled in a fixed temperature, for the purpose of controlling the size of the grain of the cast ingot, by making the cooling rate as low as possible. This method is known as a Wacker Ingot Casting Method (WICP) and a sort of modified well-known Bridgman/Stockbarger method. Another known method for casting crystalline silicon ingot, is described below and is shown in FIG. 11. This method was known as Cold Crucible method (JP-A-64-53733). The cold crucible consists of several water-cooled copper segments which are separated from each other by narrow slides. The electro-magnetic field created by the induction coil penetrates through the slides and couples into the charged material, then the melted material is lifted up by the magnetic force and heated. In this FIG. 11, numerals 29, 30 and 31 indicate a feeder, resistant heater and silicon crystal respectively.

Figure 10:
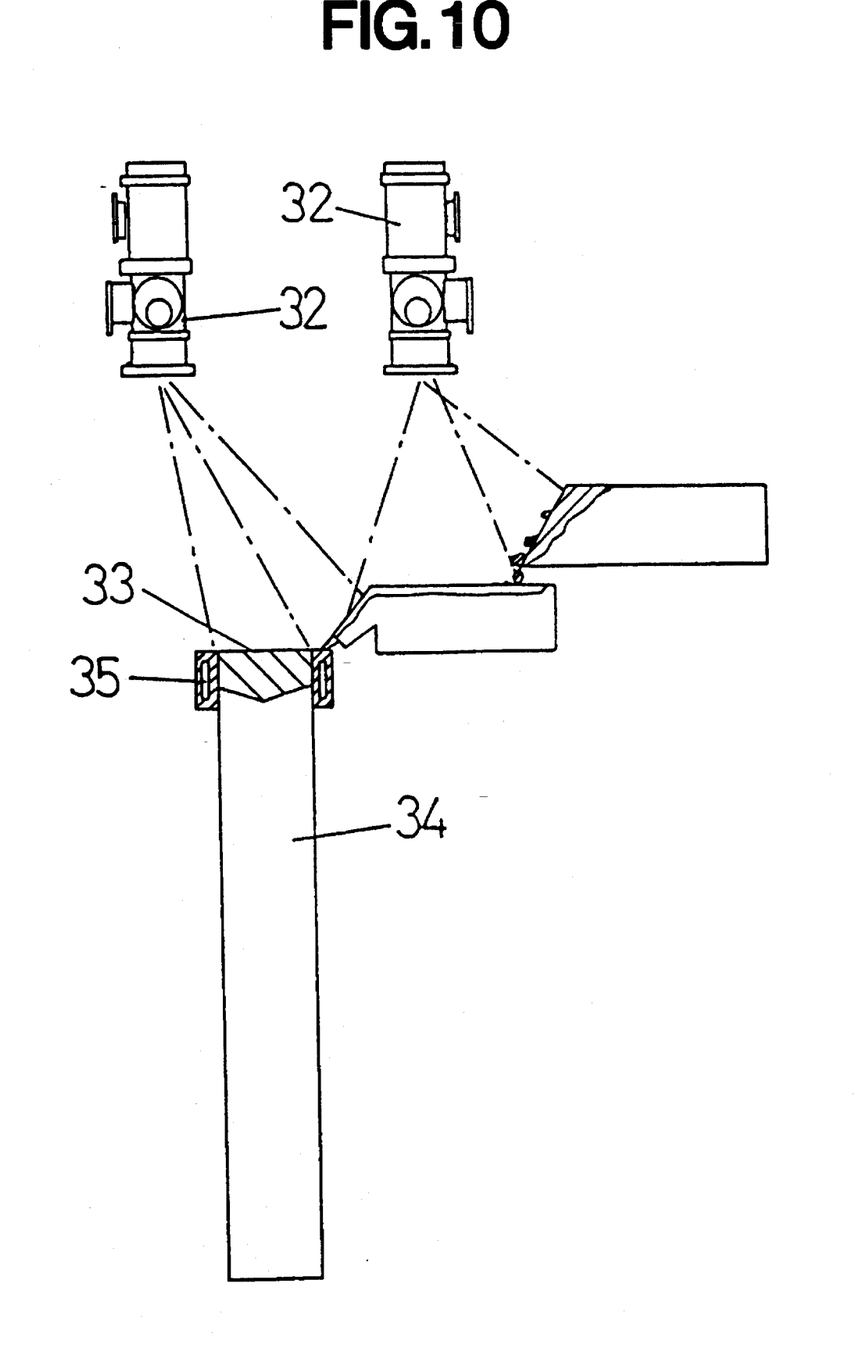
FIG. 10 is an illustration of a part of the cross section of a conventional apparatus for electron beam cold hearth melting and casting method.

Electron beam bombarding melting method (EBM) shown in FIG. 10, has also been known as an another method for casting crystalline silicon ingot. Electron beam is able to heat the melt quietly without causing any movement in molten metal 33 because electrons are accelerated in a high voltage field and bombarded to the target to heat the object. The advantage of the EBM method is to control the energy distribution within any shape of the scanning area of the ingot 34. In this FIG. 10, a numeral 35 indicates a water cooled crucible.

In the WICP method, material cost becomes very high because the highly pure materials should be used for crucible and mold, and the contamination from the de-molding flux can be expected in a high level. The maximum size of the cast ingot can be less than 100 kg, because of the controlling of the temperature of the mold, and of the limit of the effect of the removing of the impurities from the ingot by the effect of the concentration of the impurities from the solution in the ingot. The limitation of the ingot size would cause some problem for the increase of the size of the apparatus for the future expansion of the product. Above-mentioned "cold crucible-continuous casting method", however, is not only very difficult to operate but also consumes a considerable power for maintaining the melt and cooling the cold crucible. The melt is also stirred very much by electromagnetic magnetic force which may influence slightly the crystal growth during the solidification. The inner diameter of the coil has some limits concerning the electromagnetic force, and it may be difficult to cast the same size of WICP's ingot. From this point, "cold crucible-continuous casting method" has to be developed still more to meet the demand of production in large scale.

And, EBM has also a problem in casting operation. In general, the casting process of EBM is discontinuous in the ingot pulling down method. It is very difficult to maintain the casting operation because the first part of the ingot which solidifies is always contacting the water-cooled copper crucible, which is different from "cold crucible-continuous casting method", and the casting face is cooled down at a rapid speed so that stress is always applied to the ingot forming cracks, and the cast ingot is broken off.

DISCLOSURE OF INVENTION

This invention which is modified from the above-mentioned conventional EBM method can successfully produce an ingot with large grain size continuously, and at relatively low cost, to control and release the stress which would act on the ingot by heating the first part of the solidifies, and avoiding the cracks by precipitating the ingot with the weight of itself.

The present invention is a method of casting a crystalline silicon ingot by electron beam melting, comprising of the steps of melting a silicon material by scanning the same with an electron beam, processing the outer rim of the bottom side of the molten silicon thus produced so as to generate a crystalline silicon ingot, and gradually precipitating the crystalline silicon ingot in a very slow speed by the weight of itself in accordance with the generation of the crystalline silicons. The invention also a method of casting a crystalline silicon ingot by electron beam melting, comprising the steps of melting a silicon material which is charged into a cold hearth by scanning the same with an electron beam, pouring the molten silicon thus produced into a crucible so as to generate a crystalline silicon ingot from the bottom side of the crucible successively, and gradually precipitating the crystalline silicon ingot in a very slow speed by the weight of itself. Another embodiment is a method of casting a crystalline silicon ingot by electron beam melting, comprising the steps of melting a silicon material which is charged through a means for protecting the material from the contamination into the cold hearth by scanning the same with an electron beam, pouring the molten silicon thus produced into the crucible so as to generate a crystalline silicon ingot successively by chilling the surface of the molten silicon exposed from the bottom side of the crucible, and gradually precipitating the crystalline silicon ingot in a very slow speed by the weight of itself. A further embodiment is a method of casting a crystalline silicon ingot by electron beam melting, comprising the steps of melting a silicon material which is charged through the means for protection from the contamination into the cold hearth by scanning the same with an electron beam, pouring the molten silicon thus produced into the crucible so as to generate a crystalline silicon ingot successively by chilling the surface of the molten silicon exposed from the bottom side of the crucible, precipitating the crystalline silicon ingot in a very slow speed, and removing some part of the molten silicon which has a high concentration of impurities from the upper part of the crucible by lifting up the crystalline silicon ingot in a very slow speed at regular intervals in order to avoid the concentration of the impurities in the crystalline silicon ingot. In the before described methods, the molten silicon is flowing down from the cold hearth to the crucible by the head between the surface of molten silicon in the cold hearth and the surface of molten silicon in the crucible, and helium gas is introduced by blowing to the surface of the molten silicon at the bottom of the crucible in order to promote the crystal growth. Also, the crystalline silicon ingot is precipitated in a very slow speed and rotated during said precipitation. The before described protecting means is a lining or coating which is applied on the surface of the supplying means for the silicon material in order to prevent the molten silicon from the intermixing of iron, etc.

The present invention also provides an apparatus for casting crystalline silicon ingot by electron beam melting, in which silicon material supply means is provided at one side of a cold hearth, one side portion of a crucible being joined to the upper portion of the other side of the cold hearth via a groove, an electron gun which is capable of scanning the whole area of the cold hearth and crucible being provided above the cold hearth and crucible, a cooling means being attached to the wall of the crucible, a retaining means for crystalline silicon ingot which can move vertically being provided just under the crucible. Another apparatus for casting crystalline silicon ingot by electron beam melting, in which silicon material supply means is provided at one side of a cold hearth which has a rectangular shape toward the crucible and being attached with a preventing means for the impurities located at the upper part of the cold hearth and near the surface of the molten silicon, one side portion of a crucible being joined to the upper portion of the other side of the cold hearth via a groove, an electron gun which is capable of scanning the whole area of the cold hearth and crucible being provided above the cold hearth and crucible, a cooling means being attached to the wall of the crucible, a retaining means for crystalline silicon ingot which can move vertically being provided just under the crucible. In the before described apparatuses, the silicon material supply means consists of a drum screw conveyer and chute which are operational under vacuum condition and being lined or coated in order to prevent contamination such as the intermixing of iron, etc. into the silicon material. The before described cooling means of the crucible is water-cooled, and the thermal conductivity is done by introducing helium gas. Further, the retaining means for crystalline silicon ingot is made of a water-cooled plate which can move vertically or a water cooled-plate which can move vertically and is coupled with a rotating means. And the preventing means for the impurities is a water-cooled copper tube which is installed on the upper part of the cold hearth at right angles to the moving direction of the molten silicon, and a part of said tube is dipped in the surface of molten silicon.

This invention, as a casting method by electron beam melting, can be thought to have advantages mentioned below:

(1) high energy density,
(2) heat up the silicon material quietly,
(3) scanning a wide area with any shape and speed by electromagnetic deflection,
(4) control the energy density which is distributed into the silicon material freely,
(5) good refining effect with melting in a high vacuum, and
(6) no contamination from the parts which contact with the melt such as crucible and hearth made of water cooled copper.

In this invention, because the material silicon can be melted by electron beam, it is possible to heat the determined area in determined temperature range comparably quietly, and it is also possible to control the penetration depth of heating.

In this invention, because the crystalline silicon ingot is precipitated with the weight of itself, it is possible to precipitate the ingot in a precisely controlled speed which corresponds to the generation of the crystalline silicon without any partial strain.

In this invention, because the melting of the silicon material and the growth of the crystalline silicon proceed under the precise control of removing the impurities and avoiding the contamination, it is possible to produce a highly pure ingot with large grain size continuously and in a large scale.

In this invention, because the silicon material can be melted by electron beam, it is possible to melt the silicon material in a programmed sequence, and as a result, it is possible to cast effectively the crystalline silicon ingot with a comparably large grain size with a good character by the precise control of the precipitation speed of the ingot.

In this invention, because the casting capacity can be improved for the production of large ingot, it is possible to improve the productivity and contribute to the drastic cost reduction for the production of the ingot.

And by the apparatus, it is possible to produce in a large scale the crystalline silicon ingot with a good character successively which is free from inner induced crack and strain.

BEST MODE FOR CARRYING OUT THE INVENTION (Embodiment 1)

The embodiment of this invention will now be described in detail.

The granule material of silicon (grain size 3–20 mm) is charged into the cold hearth in a constant speed of 6 kg/min. in a vacuum range of $10^{-4}$ mbar.

The cold hearth has a rectangular shape whose length is long to the moving direction of the melt, made of water cooled copper and whose area and depth is 2,700 cm$^2$ and 5 cm respectively. The charged material is melt down by the scanned electron beam which is generated from an electron beam gun of, for example 250 kw, which is located above the cold hearth. The melting rate is about 330 kg/Hr. The resulted melt flows to the crucible after the impurities are removed in the cold hearth. The melt in the crucible is also heated up and kept in a same condition by the scanned electron beam which is generated from electron beam gun which is located above the crucible. The surface of the melt which is contacting the wall of the crucible is frozen because the wall of the crucible is made of water cooled copper. There is a volume expansion of approx. 9% in solidification of silicon, and the shape of the lower part of the casting crucible should be good enough not to disturb the crystalline silicon ingot to go down. For the purpose of improving the thermal conductivity under the crucible, forming a solid chilled layer in a short time and promoting the crystal growth, helium gas is introduced between the inside of the lower part of the crucible and crystalline silicon ingot. At the same time, electron beam is programmed to sweep near the edge of crucible to avoid growth of the chilled layer. And electron beam is programmed to concentrate in the center of the crucible to keep the deep pool. In this way, the crystalline silicon ingot is generated by precipitating the ingot in a very slow speed with the weight of itself. It is favorable for the smooth precipitating of the crystalline silicon ingot, that the weight of the starting ingot should be more than a certain amount, for example, more than 200 kg. For this purpose, the total surface area of the crucible is designed as more than 4,700 cm$^2$. In this way, poly-crystalline silicon ingot of 680 mm long × 680 mm wide × 900 mm height, total weight of which is 970 kg without starting block was successfully cast with the input EB power of 535 kw. The preferable range of input EB power is from 300 kw to 600 kw. The melting of silicon and the holding of the melt can be done at the same time within this range of input EB power.

The range of the crystal grain size of above mentioned ingot was 3–30 mm and the average was 6–10 mm. Specific impurity level was Fe 15 ppbw, Al<8 ppbw. The conversion rate of solar energy of a solar cell module made from this ingot was 14.5% and this figure is almost the same level of the current top data of the well known poly silicon type solar cell.

In this embodiment, it is favorable to remove some amount of the melt from the pool in the crucible in a certain interval which has been investigated, for example at intervals of a little under two hours, in order to avoid the penetration of the impurities to the crystalline silicon ingot from the pools where impurities are concentrated during the long casting operation. For example, some ditches are carved in the upper edge of the crucible and stoppers are put on it in a normal casting operation. These stoppers are removed in case of need, and some part of the melt in the pool in which the impurities is concentrated is removed. In this operation, the melt is effectively over-flowed by moving up the cast ingot slowly. It is preferable to conduct this moving up operation at intervals of a little under two hours.

According to this embodiment, production cost of the crystalline silicon ingot can be drastically reduced, for example, about one fourth of the cost of the conventional method, because a high quality ingot can be cast effectively with this method.

In this embodiment, the crystalline silicon ingot is heated from the side and just under the crucible, to avoid the crystalline silicon ingot from crack generation. The range of preferable heating temperature is from 1000 deg. C. to 1350 g. C. It is well known that the critical cooling speed to avoid cracks during the casting of silicon is less than 15 deg. C./min. In this embodiment, the ingot should be heated in the range above mentioned, because the speed of precipitating ingot is in the range of from 1 mm/min. to 8 mm/min. Usually, an the ingot retraction system is controlled by lifting the ingot up and down, and this method may cause the generation of stress which may originate cracks and break down the ingot. In order to avoid such problem, an ingot including the starting block should be heavy enough to be precipitated by the weight of itself and the whole ingot should not be fixed in the retraction unit on which the ingot is placed. This retraction unit can move up and down. The speed of precipitating the ingot is in the range of from 1 mm/min. to 3 mm/min. This data is based on the embodiment of WICP method and cold crucible method. The preferable weight of the starting ingot should be more than 200 kg. It is also possible to precipitate the ingot with rotating. In this case, the shape of the cross section of the crucible should be round. The rotating speed is about 5 rpm, while the diameter of the ingot is 76 cm and the weight is about 1000 kg. If the rotation speed may exceed more than 5 rpm, the mechanical stress may be increased and cause cracks and break the ingot. The starting block should also be made from the finished product prior to the operation, in order to start the ingot precipitating smoothly. Also in order to avoid the ingot from sticking or hanging with the crucible, the upper edge of the crucible should be free from the frozen splash by programmed electron beam bombarding.

Once a silicon melt is contaminated with iron (Fe), Fe can not be removed during the EB melting. The charging means such as drum screw conveyer or chute which silicon material passes through before charged into the cold hearth, is usually made of steel bearing materials like stainless steel. It is a preferable countermeasure to protect the silicon material from the contamination of Fe, to coat the surface of the charging means which is directly contacted with the silicon material, with quartz or silicon nitride.

(Embodiment 2)

Figure 1:
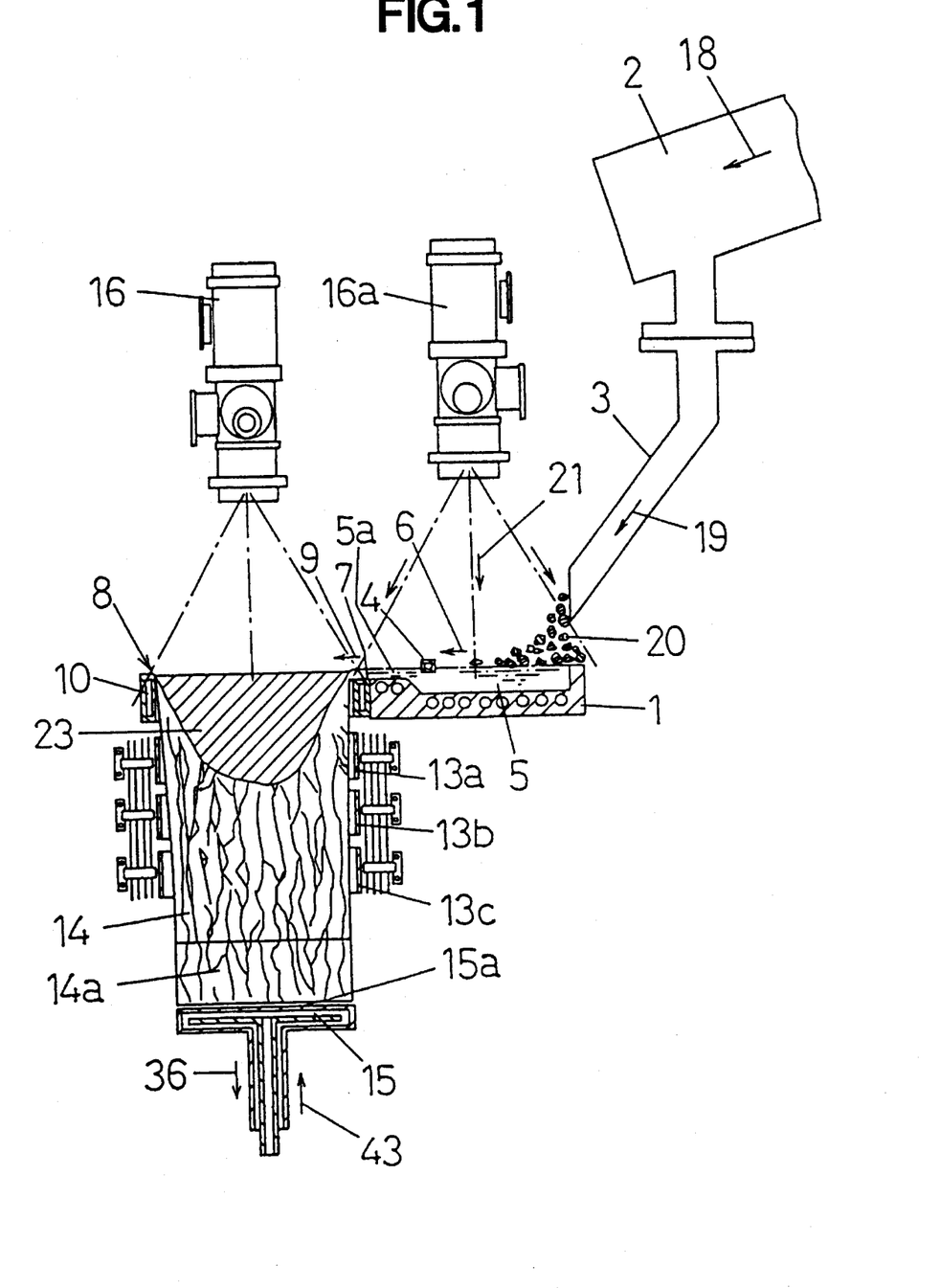
FIG. 1 is an illustration of a cutaway front view of the embodiment of this invention.
Figure 2:
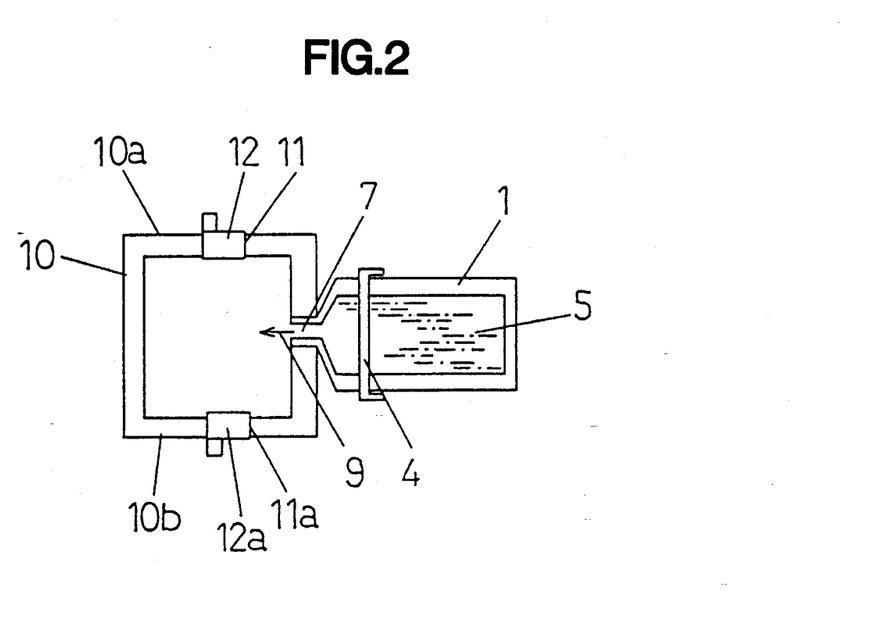
FIG. 2 is an illustration of a partial plan view.
Figure 3:
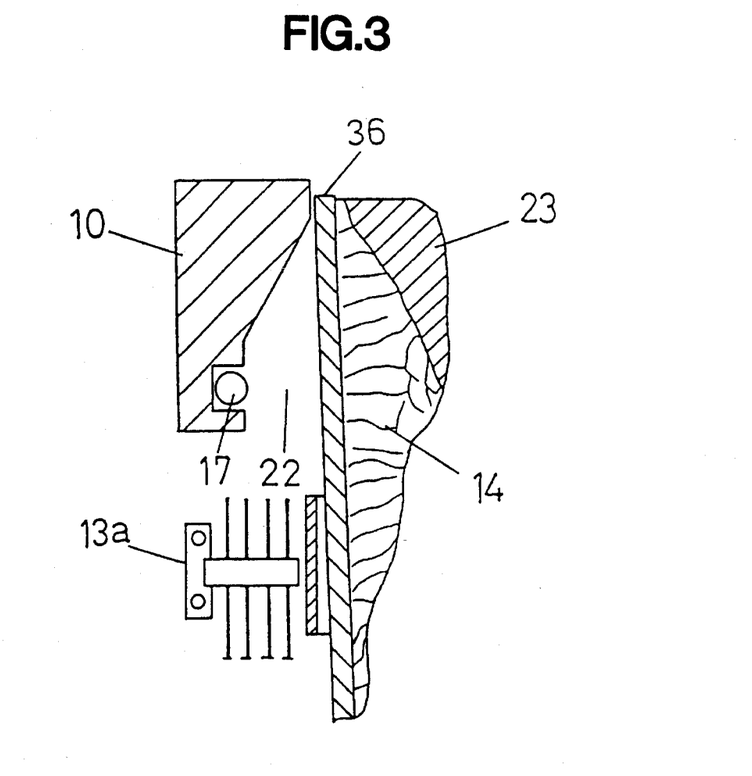
FIG. 3 is an illustration of a part of enlarged cross section just under the crucible.

The apparatus of this invention is described with FIG. 1–FIG. 3.

In FIG. 1, the lower part of the chute 3 of the vacuum tighten screw conveyer 2 is located on an upper side of cold hearth 1. The surface of the screw conveyer 2 and chute 3 is coated with quartz or silicon nitride in order to prevent the silicon material which passes through them from the contamination of Fe. Above-mentioned cold hearth 1 is a vessel made of water cooled copper with rectangular shape, and the water cooled tube 4 is installed at right angles to the moving direction of the silicon melt 5 (as shown by an arrow 6) on the center of the cold hearth 1. This water cooled tube 4 is the preventing means for the impurities on the surface of the silicon melt. Each end of the tube 4 is fixed on the wall of the cold hearth 1 (see FIG. 2), and bottom part of the tube 4 is dipped in the silicon melt 5 (see FIG. 1). The groove 7 is set up on the other upper side of above-mentioned cold hearth 1 and connected to a side of the crucible 8. The pool levels of the cold hearth 1 and the crucible 8 are the same. If the pool level of the cold hearth 1 is going up, the silicon melt is flowing through the groove 7 toward the crucible 8 as shown by an arrow 9 and the silicon melt 5 is moving at a very slow speed according to the difference in the pool levels. The above mentioned crucible 8 is a rectangular shape shown from the top view, and made of water cooled copper wall 10 as shown in FIG. 2. There are ditches 11, 11a, on side walls 10a, 10b, respectively, and detachable stoppers 12, 12a are installed on the ditches. The cross section area of the crucible 8 is designed in more than 4700 cm². A resistant heater assembly made of three sets of resistant heating elements, 13a, 13b, 13c, from the top, is installed just under the water cooled copper wall 10. The pipe set 17 of helium gas is installed between the above mentioned three sets of resistant heating elements, 13a, 13b, 13c and the water cooled copper wall 10. Helium gas is introduced through this pipe 17 and blown against the whole surface around a solid chilled layer 36 which is generated at the surface of crystalline silicon ingot just under the crucible for the purpose of promoting the crystal growth and improving the thermal conductivity under the crucible. The bottom plate 15 with ingot retraction system is installed under the crucible 8 and the starting block 14a for withdrawing the silicon ingot 14 is put on the bottom plate 15. Above mentioned bottom plate 15 is water cooled and mirror-polished on the surface for a good thermal conductivity which can absorb a heat from the starting block 14a. The bottom of the starting block 14a is also mirror-polished for the same reason. The electron beam guns 16a, 16 are installed above the cold hearth 1 and the crucible 8, respectively. The type of the above mentioned electron beam guns 16a, 16 should be a pierce type because of the good reliability for high power and high frequency oscillation. The upper space of the above mentioned cold hearth 1 and the crucible 8 is controlled to maintain vacuum and at least, the silicon melt can not be exposed in the air. The method and the apparatus for the above mentioned controlling in vacuum are publicly well known but the mechanical pump set which may generate some vibration should be installed in a distant place and several countermeasure means should be introduced to protect the whole melting vessel from the vibration for the purpose of maintaining the stability of the production of crystalline silicon ingot.

The embodiment of the use of this apparatus will now be described in detail. The cylindrical screw conveyer 2 is started and the silicon material 20 is charged in a constant amount from the raw material hopper (not illustrated in the FIG. 1) to the direction indicated as arrow 18, and charged in a side of cold hearth 1 through the chute 3 to the direction indicated as arrow 19. In the meantime, the electron beam gun 16a is installed above the cold hearth 1 and the beam emitted from the electron beam gun 16a is scanning over the silicon material on the cold hearth 1. Then, the silicon material 20 is melted down successively by bombarding of the electron beam as shown by an arrow 21 and the melt is collected in the cold hearth 1. The pool level 5a of the silicon melt 5 collected in the cold hearth 1 goes up higher than the bottom of the groove 7, then the melt flows to the crucible 8 as the direction shown in arrow 9. The melt going into the crucible 8 has no chance of pouring out from the crucible because the starting block 14a is already set in the lower part of the crucible 8 prior to the melting operation. The silicon melt 5 which entered into the crucible 8 is cooled down by the water cooled copper wall 10 of the crucible 8 and crystallized successively, and then the bottom plate 15 is withdrawn down to the direction indicated as arrow 36 with the growth of the crystalline silicon ingot. The bottom plate 15 is withdrawn down in a very slow speed such as 1 mm/min to 3 mm/min with the weight of the formed ingot itself so that there is no possibility that the crystalline silicon ingot is pulled by the bottom plate 15 and cracks or inner stress are generated in the crystalline silicon ingot. Three sets of resistant heating elements, 13a, 13b, 13c are installed just under and around the crucible 8 with sufficient space, and the crystalline silicon ingot is heated by these heating element, for example, in the range of from 1000 deg. C. to 1350 deg. C., to avoid a rapid solidification of silicon. Helium gas is introduced into the space 22 between the above mentioned three sets of resistant heating elements, 13a, 13b, 13c and the water cooled copper wall 10 shown in FIG. 3, for the purpose of improving the thermal conductivity under the crucible and giving a good influence to the growth of the crystalline silicon.

As mentioned above, while the silicon melt 5 is flowing from the cold hearth 1, the impurities floating on the surface of the silicon melt 5 are removed by the water cooled tube 4. And during the long operation of the crystal growth, a lot of the impurities come out and float on the surface of the silicon melt 5 of the crucible 8. In such a case, these impurities are removed by discharging some part of the melt in the pool over the crucible by taking detachable stoppers 12, 12a from the ditches 11, 11a. The bottom plate 15 is lifted at intervals of a little under two hours in a very slow speed, and consequently, the melting part becomes shallow and it becomes easier to discharge some part of the melt. It is also effective for the control of the ingot formation with the volume expansion during solidification that the silicon melt 5 from the cold hearth is maintained in the shape of upside-down cone 23 shown in FIG. 1, by increasing the energy density in the center part of the melt by properly programming the scanning speed of the electron beam gun 16 which is installed above the crucible 8.

(Embodiment 3)

Figure 4:
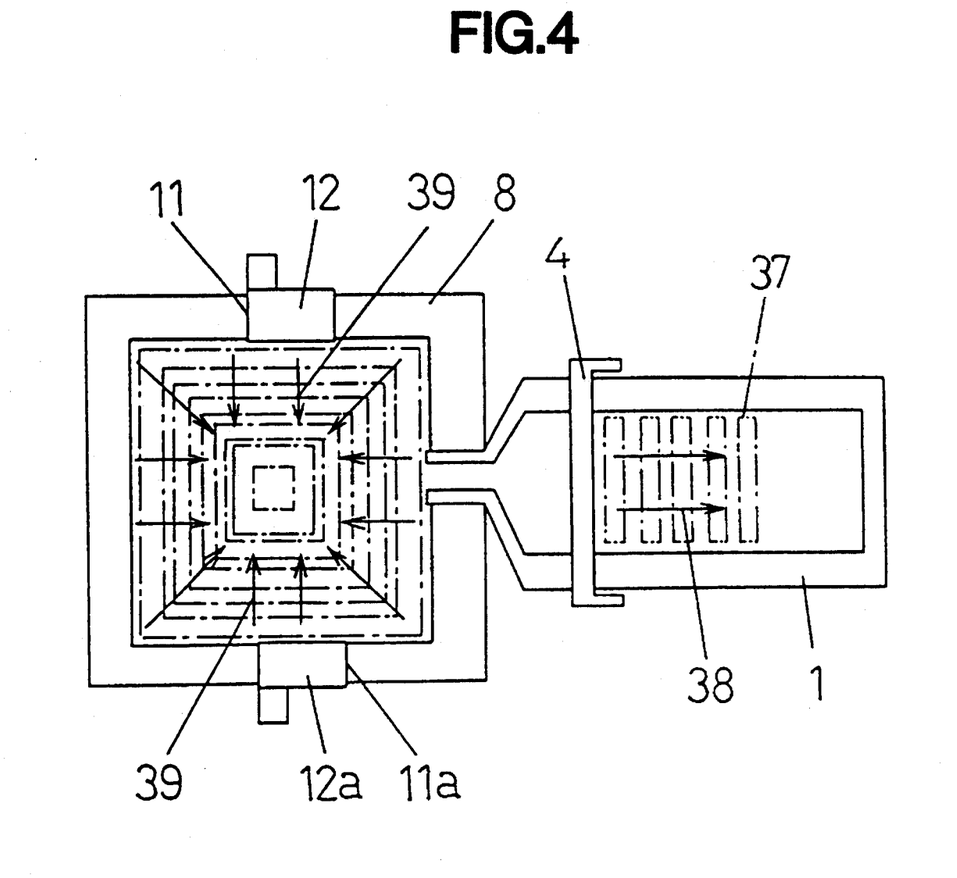
FIG. 4 is an illustration of the plan view of the concentration method of impurities by electron beam oscillation.

In this invention, the impurities are concentrated in the melt of the crucible 8, and then some part of the melt in the pool is discharged over the crucible in a certain interval which has been investigated, for example at intervals of a little under two hours. In this case, the ditches 11, 11a, are provided on the upper rim of the crucible 8 and the detachable stoppers made of water cooled copper 12, 12a are installed on the ditches or solidified silicon lump is provided on the ditches beforehand, and detachable stoppers 12, 12a are put off mechanically, or the solidified silicon lump is removed by the electron beam bombarding, and then some part of the melt in the pool, which has a high concentration of impurities, is discharged from the ditches 11, 11a as shown in FIG. 2 and FIG. 4. In this time, the bottom plate 15 is lifted in a very slow speed, and consequently, the pool level of the melt in which impurities are concentrated goes up (as shown by an arrow 43 in FIG. 1) and the melt is discharged effectively.

Figure 5:
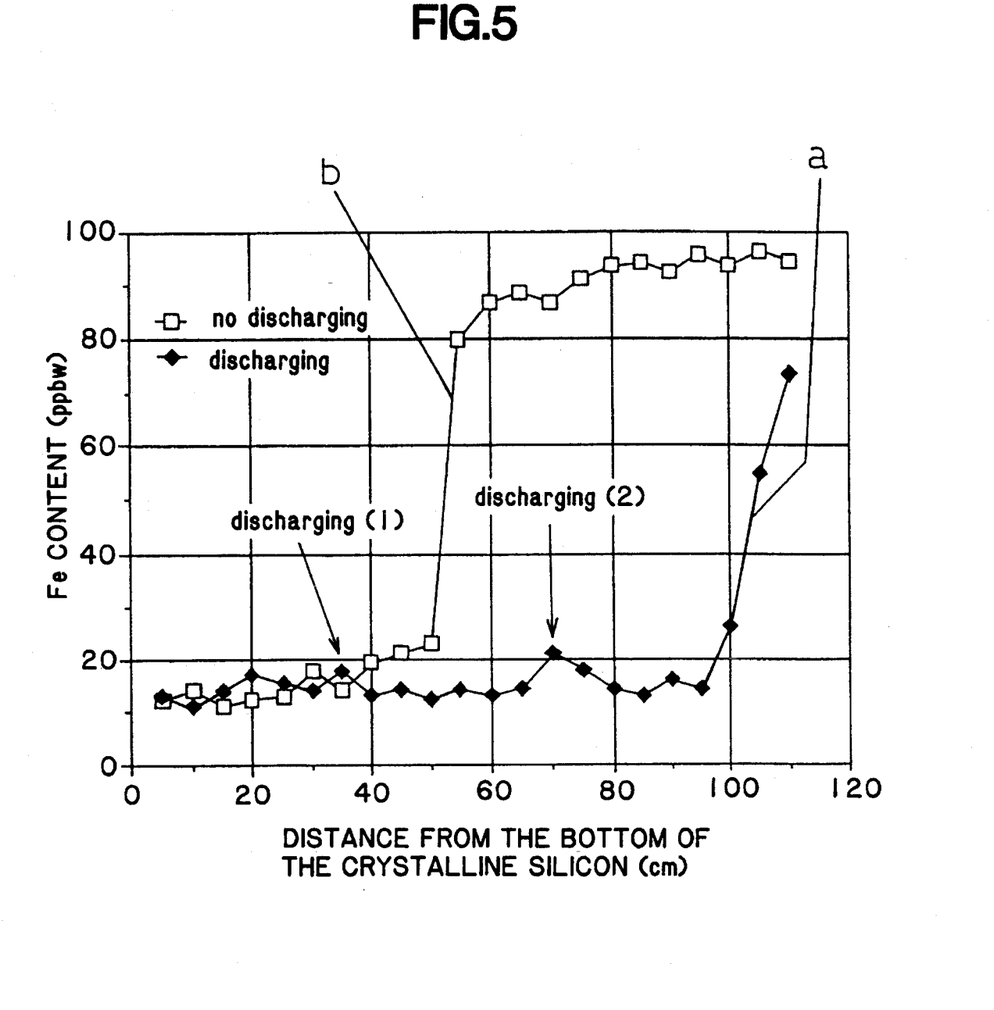
FIG. 5 is an illustration of a graphic chart of the distribution of impurities between the method with and without discharging the melt during the operation.

Being shown in the graph a of FIG. 5, Fe content is constantly less than 20 ppbw even in the point which is 90 cm distant from the bottom of the crystalline silicon, because the melt in which impurities are concentrated is discharged at the point (1) and (2), respectively. On the contrary, in the case that there is no discharging operation, being shown in the graph b of FIG. 5, Fe content is increasing suddenly and Fe content is more than 80 ppbw in the point which is 60 cm distant from the bottom of the crystalline silicon. Fe content in the crystalline silicon ingot, which may be applied for the silicon device of a solar cell, should be lower constantly. So, it becomes clear that if the ingot has been processed without the discharging operation, only the part of the crystalline silicon ingot whose distance from the bottom of the crystalline silicon ingot is less than 40 cm should be available, and this fact may have a strong influence on the yield of the crystalline silicon ingot.

(Embodiment 4)

As shown in FIG. 4, the electron beam is programmed to repeat to repeatly move slowly to the direction indicated by an arrow 38 and let the impurities floating on the melt stay in the back of the cold hearth 1 for the purpose of preventing the impurities from going to the crucible 8. Some part of the impurities which is still going through the barrier of the cold hearth 1 is concentrated in the center of the melt in the crucible 8 for the purpose of preventing the impurities from going into the crystalline silicon ingot during casting, by the method that the electron beam is programmed to repeat to repeatly move slowly to the direction indicated in arrow 39, 39.

(Embodiment 5)

Figure 6:
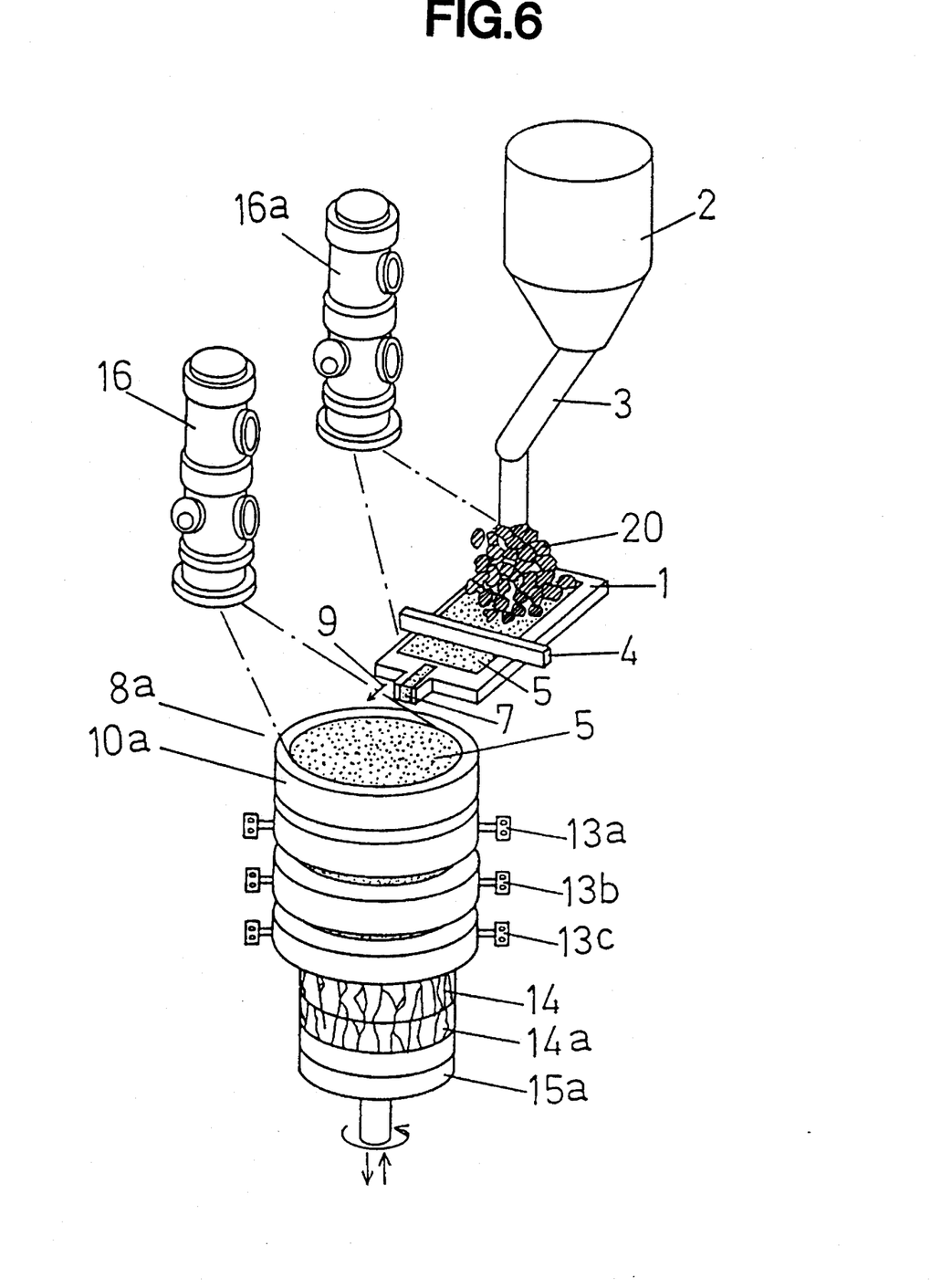
FIG. 6 is an illustration of a perspective view of another embodiment of this invention.

Another apparatus of this invention is described with reference to FIG. 6 and FIG. 7.

In this embodiment, the crucible 8a whose cross section is round is introduced instead of the crucible whose cross section is rectangular in embodiment 2 which is mentioned above. The bottom plate 15a with ingot retraction system is also equipped with the rotating system(not shown in the FIG. 6). This apparatus enables the crystalline silicon ingot to precipitate and rotate at the same time. The crucible 8a shown in FIG. 6 and FIG. 7 is not equipped with the detachable stoppers and the ditches such as in the crucible 8 in the embodiment 2. But, it is possible to equip with these devices.

The other parts of the apparatus of this embodiment are the same as those of the apparatus of the embodiment 2. So, the explanation about this part can be skipped. It is also favorable in this embodiment, for the smooth precipitating of the crystalline silicon ingot, that the weight of the starting ingot should be more than a certain amount, for example, more than 200 kg, and the total surface area of the crucible 8a is designed as more than 4,700 cm$^2$.

The pool level 5a of the silicon melt 5 collected in the cold hearth 1 goes up higher than the bottom of the groove 7, then the melt flows to the crucible 8a by the direction shown in arrow 9 according to the difference in the pool levels. The silicon melt 5 which entered into the crucible 8a is cooled down by the water cooled copper wall 10a of the crucible 8a and crystallized successively, and then the bottom plate 15a is withdrawn down in a very slow speed with the weight of the formed ingot itself. In this time, the bottom plate 15a is rotated by the above-mentioned rotating system (not shown in the FIG. 6), and then, the crystallized silicon ingot is rotated and withdrawn down in a very slow speed.

The resulted ingot has a better quality compared with the ingot which is cast only by withdrawing down in a very slow speed with the weight of the formed ingot itself.

The rotating speed of the bottom plate 15a is at about 5 rpm, while the diameter of the crystallized silicon ingot is 76 cm and the weight is about 1000 kg. According to this rotating speed, there is little possibility that any stress which may originate cracks is generated in the ingot. The rotating speed at about 5 rpm is the upper limit. If the rotation speed may exceed more than 5 rpm, the mechanical stress may be increased. If the rotating speed is less than this range, the quality of the resulted ingot has almost no difference compared with the quality of the ingot which is cast only by withdrawing down in a very slow speed with the weight of the formed ingot itself.

Figure 7:
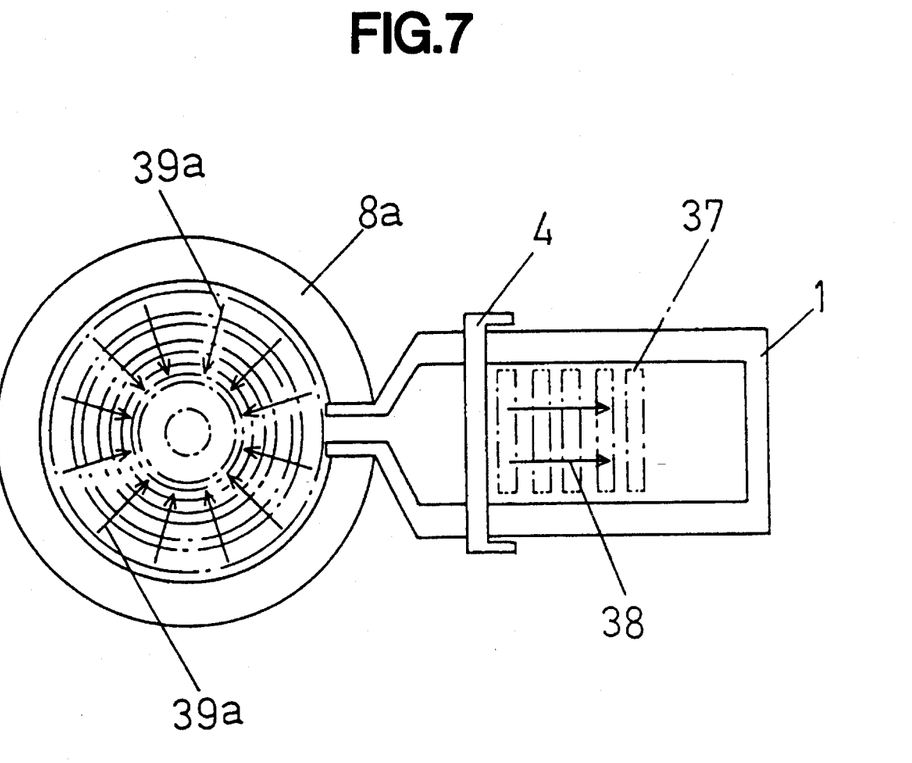
FIG. 7 is an illustration of the plan view of the concentration method of impurities by electron beam oscillation in the embodiment of FIG. 6.

As shown in FIG. 7, the electron beam is programmed in a rectangular shape 37 to repeat to move slowly to the direction indicated in arrow 38 and let the impurities floating on the melt stay in the back of the cold hearth 1 for the purpose of preventing the impurities from going to the crucible 8a. Some part of the impurities which still go through the barrier of the cold hearth 1 is concentrated in the center of the melt of the crucible 8a for the purpose of preventing the impurities from going into the crystalline silicon ingot during casting, by the method that the electron beam is programmed to repeatedly to move slowly to the direction indicated in arrow 39, 39a.

(Embodiment 6)

Figure 8:
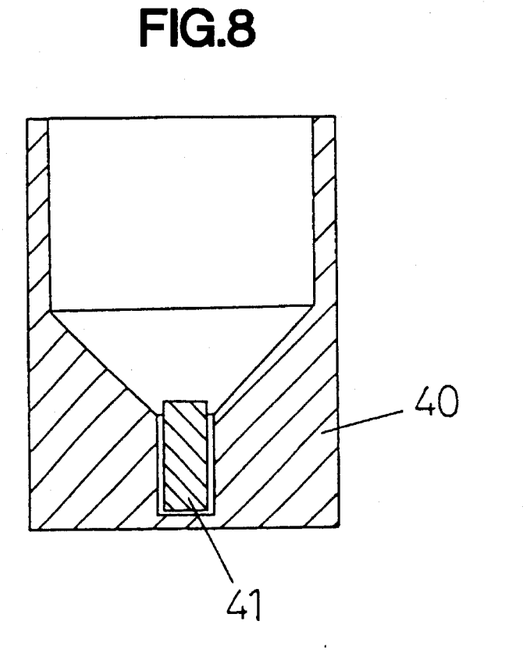
FIG. 8 is an illustration of the cross section of the mold for casting of the starting block.
Figure 9:
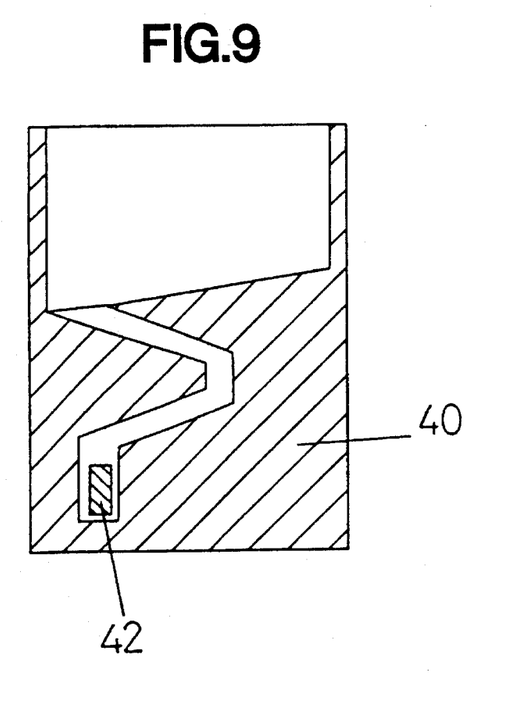
FIG. 9 is an illustration of cross section of the mold for casting of the another starting block.

The grain size of the cast ingot is deeply influenced by the grain size of the starting block so that the starting block with large grain size should be arranged before the casting operation. As shown in FIG. 8, single crystal 41 of semiconductor grade made by Czochralski method is put in the mold made of highly pure graphite 40 for casting an ingot of large grain size, and as shown in FIG. 9, a seed crystal 42 of silicon which is cut from a single crystal of semiconductor grade made by Czochralski method, for casting an ingot of single crystal is put in the mold made of highly pure graphite 40. The whole mold is set in the heater and heated up in a vacuum for degassing and maintained in the temperature near about the melting point of silicon. Then, silicon melt is poured from cold hearth 1 into the mold and after the mold is filled up, the mold is lowered gradually for the crystal growth. The material of the melt should be a silicon of semiconductor grade in consideration of the contamination from the mold. As shown in FIG. 8, the bottom of the mold should be fabricated in a cone shape in order to assist the orientation of the crystal to go up during the crystal growth. As shown in FIG. 9, a channel from the seed crystal to the bottom of the mold should be fabricated in small and winding, to assist the crystal to go up securely to the orientation during the crystal growth, in order to get the single crystal of the same orientation as that of the mold, even if the orientation of the seed crystal is not the same as the vertical direction of the mold.

As has been described above about the favorable embodiments of this invention, various alternations are of course possible within the spirit of this invention.

We claim:

1. A method of casting a crystalline silicon ingot by electron beam melting, comprising the steps of:

melting a silicon material, which is charged through protecting means for protecting the silicon material from contamination into a cold hearth, by scanning the silicon material with an electron beam to produce a pool of molten silicon;

pouring the pool of molten silicon into a crucible so as to generate a crystalline silicon ingot successively by chilling the surface of the molten silicon exposed from the bottom side of the crucible;

precipitating the crystalline silicon ingot in a very slow, controlled speed by the weight of itself; and removing some part of the molten silicon which has a high concentration of impurities from the upper part of the crucible by lifting up the crystalline silicon ingot in a very slow speed at regular intervals in order to avoid concentration of the impurities in the crystalline silicon ingot.

2. A method of casting a crystalline silicon ingot by electron beam melting as claimed in claim 1, wherein the molten silicon flows down from the cold hearth to the crucible by the head between the surface of molten silicon in the cold hearth and the surface of molten silicon in the crucible.

3. A method of casting a crystalline silicon ingot by electron beam melting as claimed in claim 1, wherein helium gas is introduced by blowing to the surface of the molten silicon at the bottom of the crucible in order to promote crystal growth.

4. A method of casting a crystalline silicon ingot as claimed in claim 1, wherein the crystalline silicon ingot is precipitated in a very slow, controlled speed by the weight of itself and rotated during said precipitation.

5. A method of casting a crystalline silicon ingot by electron beam melting as claimed in claim 1, wherein the protecting means is a lining or coating which is applied on the surface of means for supplying the silicon material to the cold hearth.

* * * * *